United States Patent
Sasaki et al.

(10) Patent No.: US 6,720,646 B2
(45) Date of Patent: Apr. 13, 2004

(54) POWER CONVERTER WITH IMPROVED LEAD FRAME ARRANGEMENT INCLUDING STAND-UP PORTION

(75) Inventors: Yasushi Sasaki, Yotsukaido (JP); Shogo Tani, Narashino (JP); Yoshihiro Uchino, Funabashi (JP); Kiyotaka Tomiyama, Funabashi (JP); Yutaka Maeno, Yotsukaido (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/384,731

(22) Filed: Mar. 11, 2003

(65) Prior Publication Data

US 2003/0146501 A1 Aug. 7, 2003

Related U.S. Application Data

(63) Continuation of application No. 09/908,564, filed on Jul. 20, 2001, now Pat. No. 6,541,851.

(30) Foreign Application Priority Data

Jul. 21, 2000 (JP) .................................... 2000-220855

(51) Int. Cl.⁷ .......................... H01L 23/52; H01L 23/48
(52) U.S. Cl. ................ 257/692; 257/690; 257/666; 257/668; 257/669; 257/784; 257/736
(58) Field of Search ................. 257/666, 674, 257/676, 677, 690, 692, 696, 735, 736, 784, 668, 669

(56) References Cited

U.S. PATENT DOCUMENTS

| 4,630,174 | A  |   | 12/1986 | Kaufman |
|-----------|----|---|---------|---------|
| 4,819,042 | A  |   | 4/1989  | Kaufman |
| 5,777,380 | A  | * | 7/1998  | Otsuki et al. ............... 257/675 |
| 6,277,225 | B1 |   | 8/2001  | Kinsman et al. ............ 156/196 |
| 6,313,598 | B1 |   | 11/2001 | Tamba et al. ............... 257/692 |
| 6,541,851 | B2 | * | 4/2003  | Sasaki et al. ............... 257/692 |

FOREIGN PATENT DOCUMENTS

| EP | 0 577 264 A1 | 1/1994 |
| EP | 07280118     | 10/1995 |
| EP | 0 732 744 A2 | 9/1996 |
| JP | 1142663      | 2/1999 |

* cited by examiner

Primary Examiner—Minhloan Tran
Assistant Examiner—Tan Tran
(74) Attorney, Agent, or Firm—Antonelli, Terry, Stout & Kraus, LLP

(57) ABSTRACT

In a semiconductor device, a lead frame is adhered to a base substrate for heat dissipation via an insulating layer, and an outward guided terminal portion is formed by perpendicularly upwardly bending an end of the lead frame after the mounting of one or more of power semiconductor elements on the lead frame. A recessed portion is formed beforehand in a portion of the lead frame to be bent, and it is ensured that the lead frame does not adhere to the surface of the base substrate in this recessed portion when the lead frame is adhered to the base substrate via the insulating layer before the bending of the lead frame. By virtue of this structure, manufacturing is simplified and manufacturing costs are reduced.

5 Claims, 6 Drawing Sheets

POWER CONVERTER WITH IMPROVED LEAD FRAME ARRANGEMENT INCLUDING STAND-UP PORTION

This is a continuation of application Ser. No. 09/908,564, filed Jul. 20, 2001 U.S. Pat. No. 6,541,851, the entire disclosure of which is hereby incorporated by reference.

BACKGROUND OF THE INVENTION

The present invention relates to a semiconductor device in which one or more of power semiconductor elements is/are mounted on a lead frame and then this assembly is insertionally molded with a resin and, particularly, to a semiconductor device in which a portion of the lead frame serving as an outward guided terminal stands up generally perpendicularly from the lead frame.

In semiconductor devices known as power semiconductor devices operating with relatively large electric power, it is an important problem as to how the heat generated by the semiconductor elements are efficiently conducted and dissipated to the outside under a sufficient withstand voltage characteristic.

Therefore, hitherto, the so-called a semiconductor device composed of a lead frame has been known, in which device the lead frame is used as a circuit conductor and one or more of power semiconductor elements is/are mounted on one surface of the lead frame and then a base substrate made from a metal having excellent thermal conductivity is joined to the other surface of the lead frame via a resin insulating layer, which is designed for realizing the compatibility between high dielectric withstanding voltage and low thermal resistance characteristics.

FIG. 8 shows an example of this semiconductor device composed of the lead frame, which is disclosed in JP-A-11-42663. As shown therein, a lead frame 13 is used, which frame is formed substantially integrally from a conductor plate of copper, etc. having a uniform thickness. This lead frame 13 is adhered to one surface (a top side surface) of a metal base substrate 15 via an insulating layer 18, whereby the lead frame can play a role as a pattern of the conductor on a usual circuit board.

A predetermined end portion of the lead frame 13 is bent so that it stands up generally perpendicularly from the bonding surface of the base substrate 15 and thus an outward guided terminal portion 17 is formed. The outward guided terminal portion 17 and one or more of power semiconductor elements 11 are electrically connected with each other to the lead frame 13 by mounting the power semiconductor elements 11 on the lead frame 13, and necessary portions are connected with each other by an aluminum bonding wire 16, whereby necessary circuits such as the main circuit, etc. of a power converter are formed.

The reason why the lead frame 13 is bent perpendicularly to the surface of the base substrate 15 is to keep an insulation distance from the base substrate 15.

At the same time, for the same reason, the bending position of the lead frame 13 comes inward from an end surface of the base substrate 15 toward the center thereof (right direction).

The lead frame 13 is adhered to the one surface (a top surface) of the base substrate 15 via the thin insulating layer 18 and, therefore, the heat generated by the power semiconductor elements 11 are conducted to the base substrate 15 via the insulating layer 18, thereby ensuring the dissipation of heat. Therefore, this base substrate 15 is fabricated from a metal plate composing a metal such as aluminum and copper, which are excellent in thermal conductivity.

The insulating layer 18 serves to adhere the lead frame 13 to the base substrate 15 and serves the function of physically spacing both apart and electrically insulating therebetween with each other. For this reason, the insulating layer 18 is made from a thermosetting resin such as an epoxy resin having a glassy-transition temperature of not less than 100° C. and this material is used in the form of a resin sheet.

A molded outer package (not shown) is adhered to the base substrate 15 by an adhesive or the like, in which package a resin such as an epoxy resin is filled. Thus, the remaining portion on the lead frame 13 except for the terminal portion 17 extending perpendicularly from the bonding surface of the lead frame 13 to the surface of the insulating layer 18, and one or more of power semiconductor elements 11 mounted thereon by bonding with a solder layer 26 are encapsulated, whereby a semiconductor device is completed.

In the above prior art, no consideration is given to the fact the terminal portion of the lead frame stands up from the bonding surface of the lead frame to be fixedly adhered to the surface of the insulating layer and, therefore, it is a problem that manufacturing process becomes complicated.

Normally, according to the prior art, if a semiconductor device in which, as shown in FIG. 8, the terminal portion 17 stands up generally perpendicularly from the bonding surface of the lead frame to be fixedly adhered to the surface of the base substrate, it is necessary to form the lead frame in such a manner that the terminal portion is bent beforehand and then to adhere this bent lead frame to the base substrate.

This is because a lead frame placed on the surface of the base substrate in an unbent state generally comes into contact with the insulating layer including the outward guided terminal portion and fixedly adheres thereto, with the result that it becomes difficult to bend the lead frame later.

A manufacturing process of semiconductor devices in accordance with the prior art will be described as shown in FIGS. 9(a) to 9(c).

First of all, as shown in FIG. 9(a), a lead frame 13 is prepared, which frame is bent beforehand so as to form an outward guided terminal portion 17. This lead frame 13 is placed on the surface of a base substrate 15 with an insulation resin sheet 18' for insulative adhesion interposed therebetween, and is then heated under pressure to thereby obtain the state shown in FIG. 9(b). The resin sheet 18' sets hard and thereafter forms an insulating layer 18. As a result, the lead frame 13 is fixedly adhered to the surface of the base substrate 15.

Next, similarly as shown in FIG. 9(b), solder printing treatment necessary for the formation of a solder layer 26 is exerted on the surface of the lead frame 13 for mounting one or more of the semiconductor elements 11 thereon. Subsequently, as shown in FIG. 9(c), the semiconductor elements 11 are superimposed on the solder layer 26 and the semiconductor elements 11 are joined to the lead frame 13 by heating under pressure. After that, a predetermined wiring is performed by means of a bonding wire 16.

In the prior art, however, there arose the following problems in these steps and thus the manufacturing process was obliged to become complicated as mentioned above.

The outward guided terminal portion 17 stands up from the lead frame 13 and, therefore, first of all, in the step of FIG. 9(a), it is necessary to prevent the interference (i.e., the collision) of the outward guided terminal portion 17 with a compression press and the like. This leads to an increase in equipment size and hence an increase in the amount of investment.

Next, in the step of FIG. 9(b), a mask and a squeegee for solder layer printing interfere with the outward guided terminal portion 17. Therefore, it is difficult to perform solder printing treatment for forming the solder layer 26 on the lead frame 13 and techniques such as screen printing cannot be applied thereto.

Further, in the step of FIG. 9(c), the outward guided terminal portion 17 stands a great physical difficulties to the operating range of mounting equipment necessary for mounting parts on the lead frame 13 and it is difficult to solve this problem with a usual mounting equipment.

SUMMARY OF THE INVENTION

The object of the present invention is to provide a semiconductor device composed of a lead frame in which the possibility of a complicated manufacturing process is prevented and a reduction in manufacturing cost can be satisfactorily achieved.

The above object is achieved by providing a semiconductor device in which a lead frame fixedly adhered via an insulating layer to one surface of a base substrate serves as a circuit conductor and on which frame one or more of semiconductors are mounted so as to bend an end portion of said lead frame in a stand-up direction from the bonding surface of the lead frame to be fixedly adhered to the surface of said base substrate as an outward guided terminal portion, wherein, in a portion of the lead frame, there is formed a recessed portion whose thickness is reduced from the bonding surface of the lead frame to be fixedly adhered to the surface of the base substrate and the lead frame is bent at this recessed portion having a reduced thickness.

The stand-up position of the lead frame from the surface of the base substrate may be spaced apart by a predetermined specific distance from an end surface of the base substrate. A curved portion following a straight portion may also be formed in a stand-up portion of the lead frame from the surface of the base substrate.

DESCRIPTION OF THE PREFERRED EMBODIMENTS

Semiconductor device according to the present invention will be described below in further detail with reference to the accompanying drawings.

Figure 1:
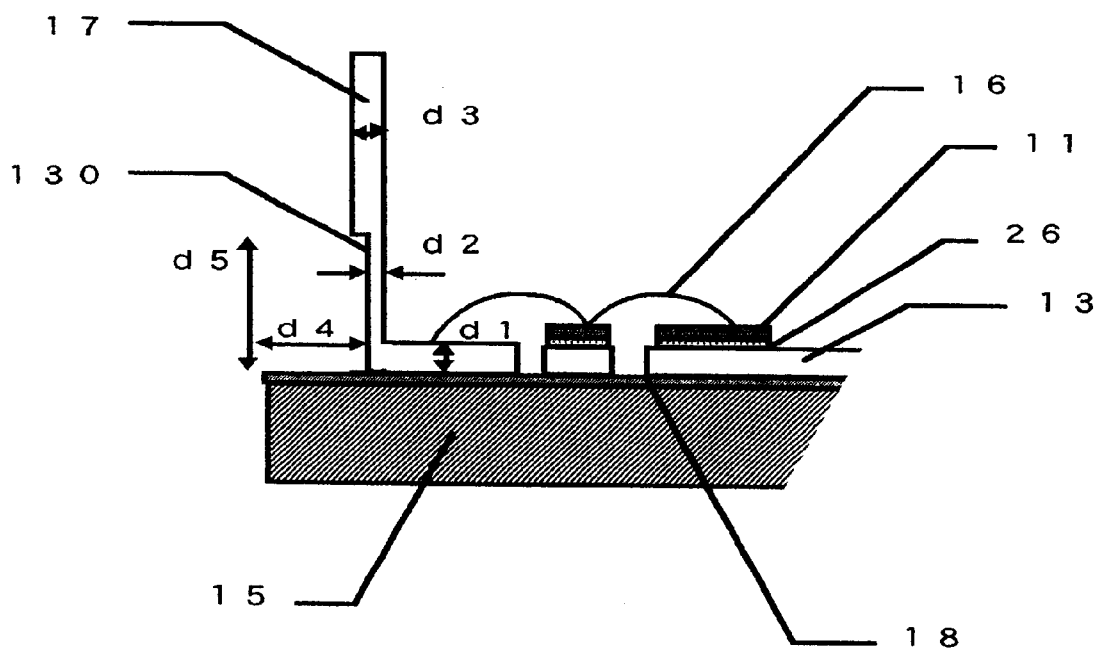
FIG. 1 is a sectional view illustrative of a first embodiment of a semiconductor device according to the present invention.

FIG. 1 shows a first embodiment of a semiconductor device according to the present invention. In this figure, one or more of power semiconductor elements 11, a lead frame 13, a base substrate 15, a bonding wire 16, an outward guided terminal portion 17 and a solder layer 26 are the same prior art semiconductor device as described in FIG. 8.

More specifically, the terminal that is guided to outside the package of the semiconductor device as the outward guided terminal portion 17 is extended on the base substrate 15 inside the package to form the lead frame 13. This lead frame 13 is fixedly adhered to the base substrate 15 with the insulating layer 18 interposed therebetween, and the power semiconductor elements 11 are directly joined to the lead frame 13 via the solder layer 26.

The lead frame 13 and the power semiconductor elements 11 are each electrically connected by the bonding wire 16 represented by an aluminum wire to form a predetermined circuit.

As described in connection with the prior art, the direction to which the lead frame 13 is to be guided as the outward guided terminal portion 17 must be perpendicular to the surface of the base substrate 15 in order to ensure a necessary insulation distance and, for this reason, the position where the lead frame 13 is perpendicularly (upward direction) bent must be spaced inside by a distance of not less than d4 from an end surface of the base substrate 15 toward the center direction (right direction) of the base substrate 15.

The distance d4 from an end surface of the base substrate 15 is determined by a voltage applied between the lead frame 13 and the base substrate 15 and is primarily determined by dielectric withstand voltage characteristic required for the semiconductor device.

Figure 8:
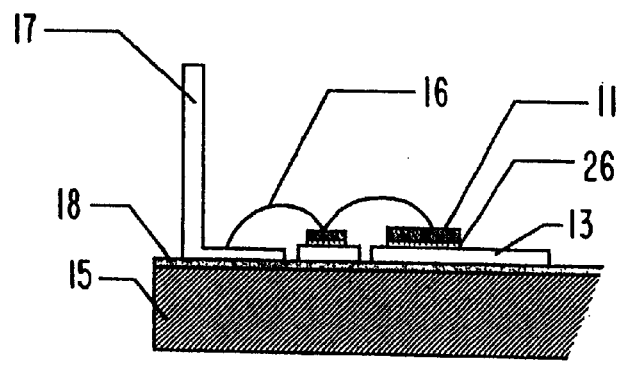
FIG. 8 is a sectional view illustrative of an example of a semiconductor device according to the prior art.
Figure 9A:
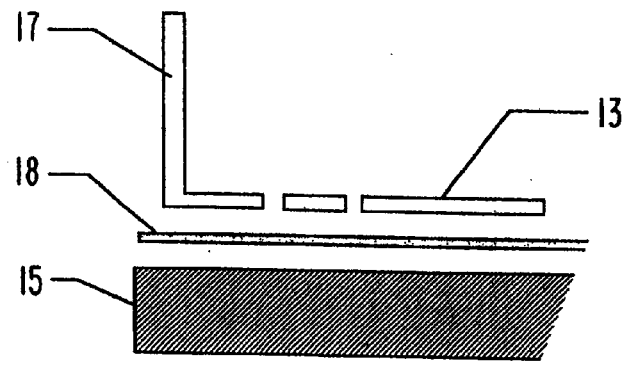
FIGS. 9(a) to FIG. 9(c) are explanatory diagrams of a manufacturing process of the semiconductor device according to the prior art.
Figure 9B:
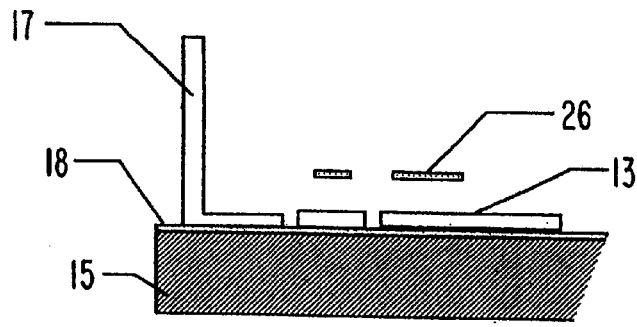
Figure 9C:
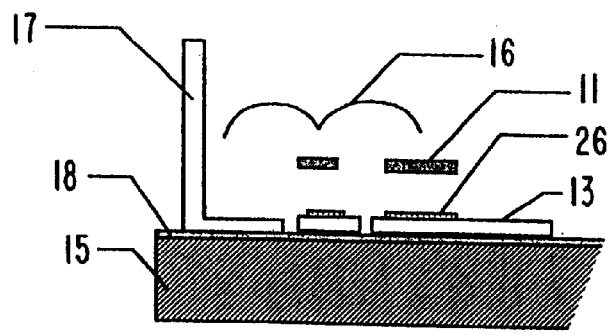

Therefore, the embodiment shown in FIG. 1 differs from that of the prior art shown in FIG. 8 in that the lead frame 13 includes portions each having different thicknesses of d1 and d2, respectively. The thickness of the lead frame 13 is adapted to be d1 (fixedly adhered portion) in a portion where the lead frame 13 is fixedly adhered to the base substrate 15 with the insulating layer 18 interposed therebetween while the thickness of the lead frame is adapted to be d2 in another portion 130 of the lead frame 13 where the lead frame 13 is bent in order to form the outward guided terminal portion 17, wherein the relationship therebetween is d1>d2 and this portion 130 having a reduced thickness is formed on the lead frame 13 in a manner such that the thickness is reduced from the bonding surface of the lead frame 13 which is fixedly adhered to the base substrate 15 via the insulating layer 18. The above-mentioned features are essential to the present invention.

In other words, the lead frame 13 of the embodiment shown in FIG. 1 differs from the prior art in that it is formed with the portion 130 having a reduced thickness, and in that the lead frame 13 is bent in this portion 130 to form the outward guided portion 17 in a perpendicular standing upright position.

In this embodiment, the lead frame 13 on which this portion 130 is formed beforehand is superimposed on the insulating layer 18 in a flat state and is fixedly adhered to the base substrate 15. After the mounting of parts, the lead frame 13 is perpendicularly bent at a predetermined position of the base substrate 15 to thereby form the outward guided terminal portion 17.

In this case, however, if the lead frame 13 including the portion to be bent is completely adhered to the insulating layer 18 as in the prior art, on bending the lead frame 13 is stripped off from the insulating layer 18, with the result that the insulating layer 18 might be damaged.

In this embodiment, therefore, in order to form the outward guided terminal portion 17, a longitudinally extending portion of the lead frame 13 is formed with the portion 130 having a reduced thickness. With regard to the length d5, it is adapted to be longer than the distance d4 necessary for insulation, that is, it is ensured that the relationship therebetween is held true to be d5>d4 and in addition to the above the lead frame 13 is adapted to be bent in this portion 130 when forming the outward guided portion 17.

The portion 130 provided in the lead frame 13 is formed, as mentioned above, on the lead frame 13 as a recessed portion from the surface on which the lead frame 13 is fixedly adhered to the base substrate 15. For this reason, even when the lead frame 13 is fixedly adhered to the base substrate 15 via the insulating layer 18 as it is, the lead frame 13 is spaced apart at a predetermined distance from the insulating layer 18 in this portion 130 and works so that it keeps a state in which the lead frame 13 is not fixedly adhered to the base substrate 15 in this portion 130.

Therefore, according to this embodiment, even when after fixedly adhereing the lead frame 13 to the surface of the base substrate 15 in a flat state via the insulating layer 18, this lead frame 13 is perpendicularly bent to thereby form the outward guided terminal portion 17, it can be ensured that there is no possibility of damage to the insulating layer 18 at all.

Next, a part of a manufacturing process of the semiconductor device according to the embodiment shown in FIG. 1 will be described with reference to FIGS. 2(a) to 2(d).

Figure 2A:
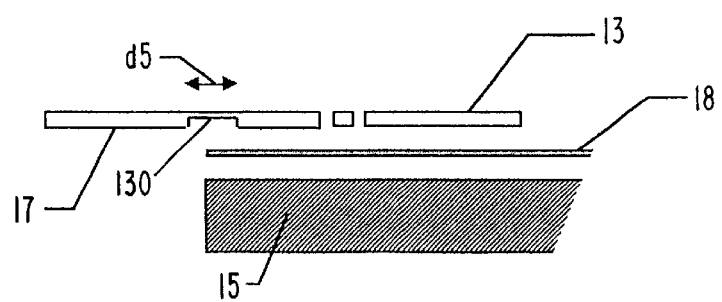
FIGS. 2(a) to 2(d) are explanatory diagrams of a manufacturing process of the semiconductor device according to the present invention.
Figure 2B:
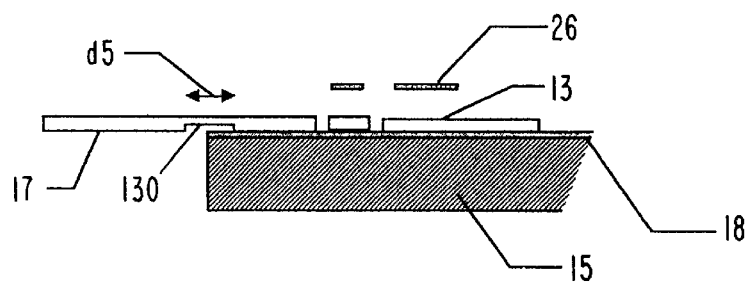

First of all, as shown in FIG. 2(a), the lead frame 13 having a reduced thickness portion 130 is prepared and superimposed on the base substrate 15 in a flat state with the resin sheet 18' interposed therebetween, and the lead frame 13 is fixedly adhered to the base substrate 15 by heating under pressure after predetermined positioning, whereby as shown in FIG. 2(b), the lead frame 13 in a flat state is adapted to be fixedly adhered to the base substrate 15 via the insulating layer 18.

The level difference between the bottom of the recessed portion of the portion 130 and the surface of the insulating layer 18, i.e., the difference between the original thickness d1 of the lead frame 13 and the thickness d2 of the portion 130 (=d1−d2) should generally be about 0.1 to 0.2 mm. However, this level difference is not limited to the above numerical values and may be arbitrarily determined according to the thickness of the lead frame 13 and specifications for the insulating layer 18.

Furthermore, with regard to the length d5 of the portion 130, the condition that it is longer than the above distance d4 required for insulation, i.e., the relationship therebetween of d5>d4 may be preferably kept. The portion 130 is not restricted to be formed in only the peripheral end portion of the base substrate 15 and but may be extended to the leading end of the outward guided terminal portion 17. Therefore, the dimensional conditions necessary for the lead frame 13 are d1>d2 and d4<d5.

Figure 2C:
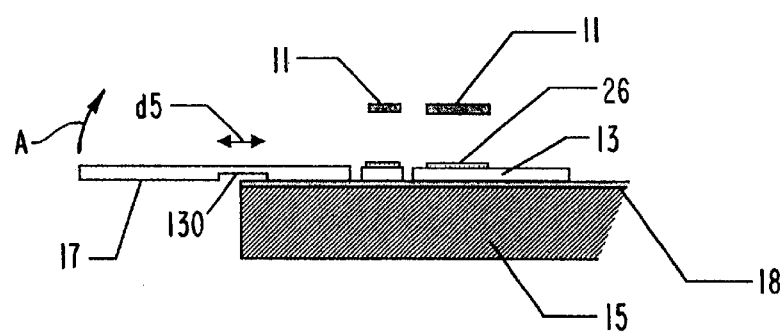
Figure 2D:
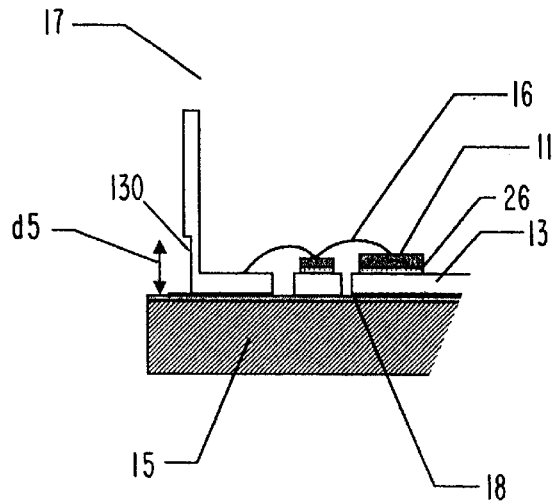

Next, similarly as shown in FIG. 2(b), a predetermined portion of the lead frame 13, i.e., the portion on which one or more of power semiconductor elements are mounted is subjected to solder printing treatment necessary for the formation of the solder layer 26 and after that, as shown in FIG. 2(c), the semiconductor elements 11 are positioned. Subsequently, as shown in FIG. 2(d), the semiconductor elements 11 are joined to the lead frame 13 via the solder layer 26 and wiring is then performed by means of the bonding wire 16.

After that, an end portion of the lead frame 13 (left side end) is held by means of a predetermined jig from the upper side in the figure so that the lead frame 13 is not stripped off from the insulating layer 18 and then, as indicated by the arrow A in FIG. 2(c), the outward guided terminal portion 17 is formed by standing the lead frame 13 up generally perpendicularly to the surface of the base substrate 15, whereby a semiconductor device in a state shown in FIG. 1 can be obtained.

In the case of this embodiment, when the lead frame 13 is fixedly adhered to the base substrate 15 via the insulating layer 18, the lead frame 13 is superimposed in a flat state on the insulating layer 18 and there are no any obstacles on the surface of the lead frame 13.

Therefore, according to this embodiment, it is possible to apply screen printing treatment by a screen mask and a squeegee without any differences from the solder printing treatment for the surface of an ordinary printed circuit board. As a result of this, the reliability of a power semiconductor device can be satisfactorily improved by the application of screen printing, which facilitates the control of various conditions such as layer thickness, shape, etc. in solder application treatment.

Furthermore, for this reason, the interference by the stand-up portion of the lead frame 13 does not occur during the mounting of parts or wire bonding. Therefore, according to this embodiment, the limitation for various kinds of equipment to be used in the assembling steps shown in FIGS. 2(a) to 2(d) can be minimized and hence a cost rise can be efficiently reduced.

In the case of this embodiment, it is possible to locate the bending position of the lead frame 13 at an arbitrary position in the portion 130 and, therefore, the lead frame 13 can be easily stood up from the arbitrary position inward from an end surface of the base substrate 15.

In addition, because the lead frame 13 may have a flat shape as it is, this lead frame 13 is excellent in the loading efficiency and is easy to be fixedly adhered and enables the quality during transportation to be easily ensured. Furthermore, when the lead frame 13 is fixedly adhered to the insulating layer 18, the size of press equipment can be minimized. This is advantageous for reducing the costs for equipment and in terms of working cost when the lead frame 13 is fixedly adhered.

Furthermore, because the lead frame 13 in this embodiment can be easily stamped by press working, etc. and is flat, it can be manufactured by the etching process in the same way as with an ordinary printed circuit board and does not require special manufacturing techniques.

Incidentally, with regard to the size d3 in FIG. 1, the relationship of d3=d1 is a basis as mentioned above. However, there is no special dimensional limitation. Therefore, the relationship of d3=d2 is allowed and other plate thicknesses may be used.

Next, a second embodiment of the present invention will be described with reference to FIG. 3.

Figure 3:
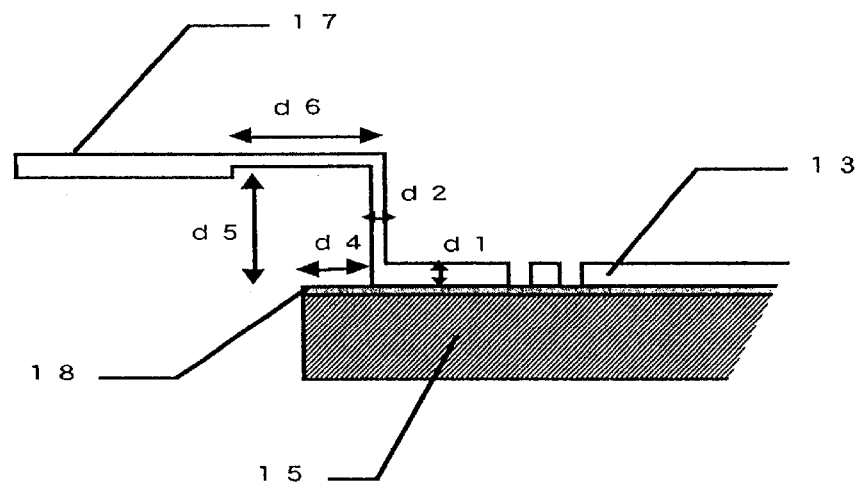
FIG. 3 is a sectional view illustrative of a second embodiment of the semiconductor device according to the present invention.

In a semiconductor device, there is provided a device in which its terminals may be led out from a peripheral portion of the package and the embodiment shown in FIG. 3 is applied to this type of semiconductor device. Therefore, the second embodiment shown in FIG. 3 differs from the first embodiment shown in FIG. 1 in that the outward guided terminal portion 17 firstly stands up perpendicularly upwardly to the base substrate 15 and then bent again at a position by the distance d5 spaced from an end surface of the base substrate 15 and is finally led out horizontally to the base substrate 15.

The distance d5 is provided, as mentioned above, in order to keep a predetermined insulation distance from the base substrate 15 and its value is determined by a voltage applied to the lead frame 13. However, once the distance d5 is obtained, there is no limitation to the bending direction or the number of bending of the leading end of the lead frame 13. Therefore, the lead frame 13 may be led out as the outward guided terminal portion 17 so that the lead frame 13 can be ultimately handled with ease as a product.

Therefore, the adoption of this embodiment shown in FIG. 3 also enables the reliability of a power semiconductor device to be satisfactorily improved and a cost rise to be efficiently reduced. Thus, the same effects as with the embodiment shown in FIG. 1 can be obtained from the embodiment shown in FIG. 3.

Next, a third embodiment of the present invention will be described with reference to FIG. 4.

Figure 4:
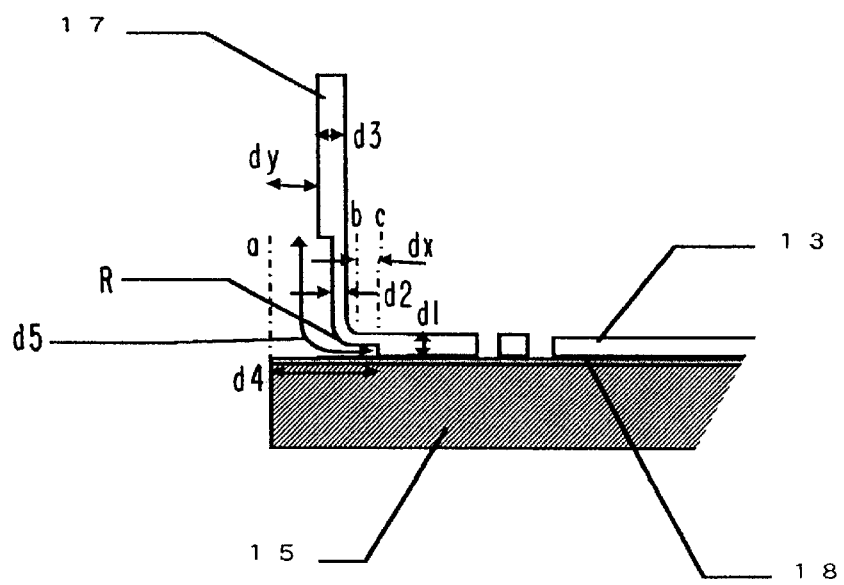
FIG. 4 is a sectional view illustrative of a third embodiment of a semiconductor device according to the present invention.

The third embodiment shown in FIG. 4 differs from the first embodiment shown in FIG. 1 in that the position in which the perpendicular bending of the lead frame 13 is started is not at one end c of the portion 130, but at a point between the one end c and the end surface a of the base substrate 15, and in that after a non-bent portion dx is provided between the above one end c and a midway point b, the lead frame 13 is perpendicularly upwardly bent while forming a curved portion R from this point b to thereby form the outward guided terminal portion 17.

Therefore, the adoption of this embodiment shown in FIG. 4 also enables the reliability of a power semiconductor device to be sufficiently improved and a cost rise to be efficiently reduced. Thus, the same effects as with the embodiment shown in FIG. 1 can be obtained from the embodiment shown in FIG. 4. In addition, because the non-bent portion dx provides a clearance portion during the bending of the lead frame 13, the bonding surface can be positively held by means of a jig and the lead frame 13 can be gently bent in the curved portion R. The shape and size of the above non-bent portion dx and curved portion R can be selectively changed as required.

Next, a fourth embodiment of the present invention applied to a semiconductor device for a power converter will be described with reference to FIGS. 5 to 7.

Figure 5:
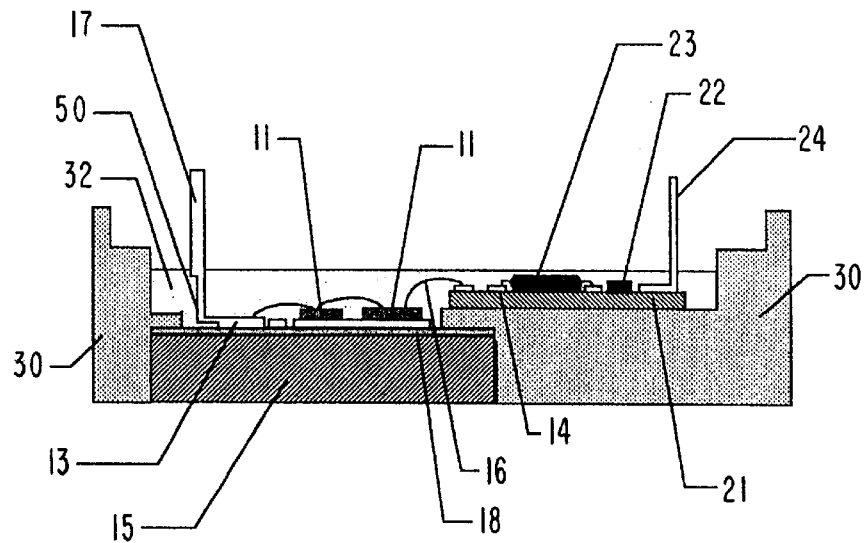
FIG. 5 is a sectional view illustrative of a fourth embodiment of a semiconductor device according to the present invention.
Figure 6:
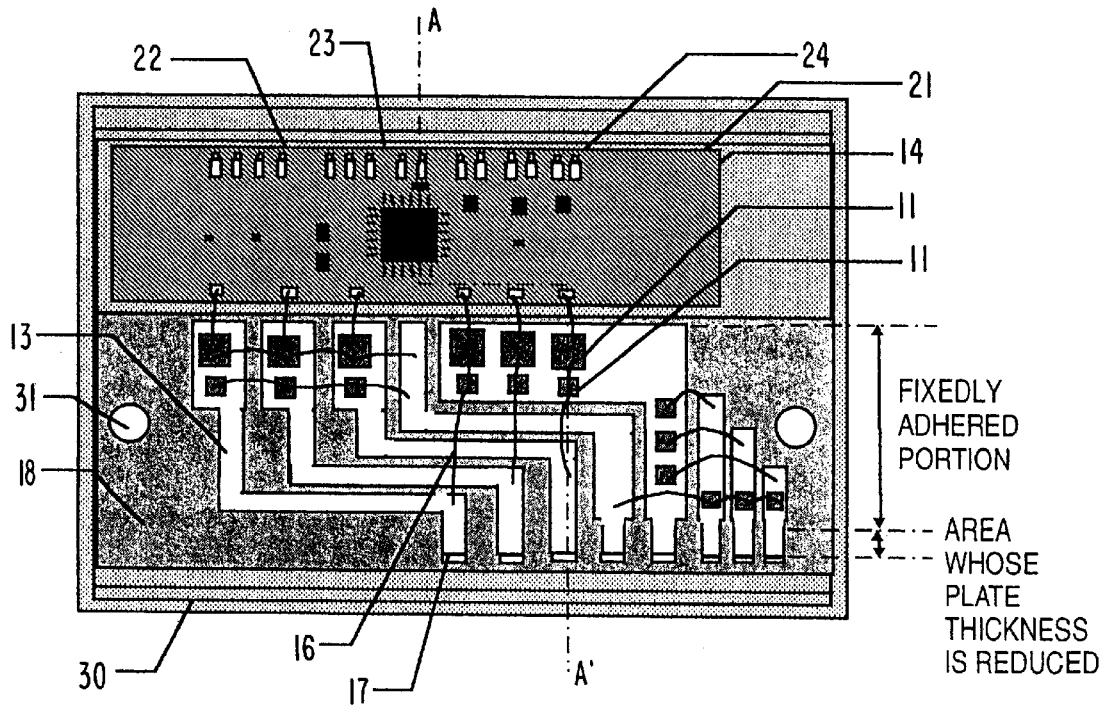
FIG. 6 is a top plan view illustrative of the fourth embodiment of the semiconductor device according to the present invention.
Figure 7:
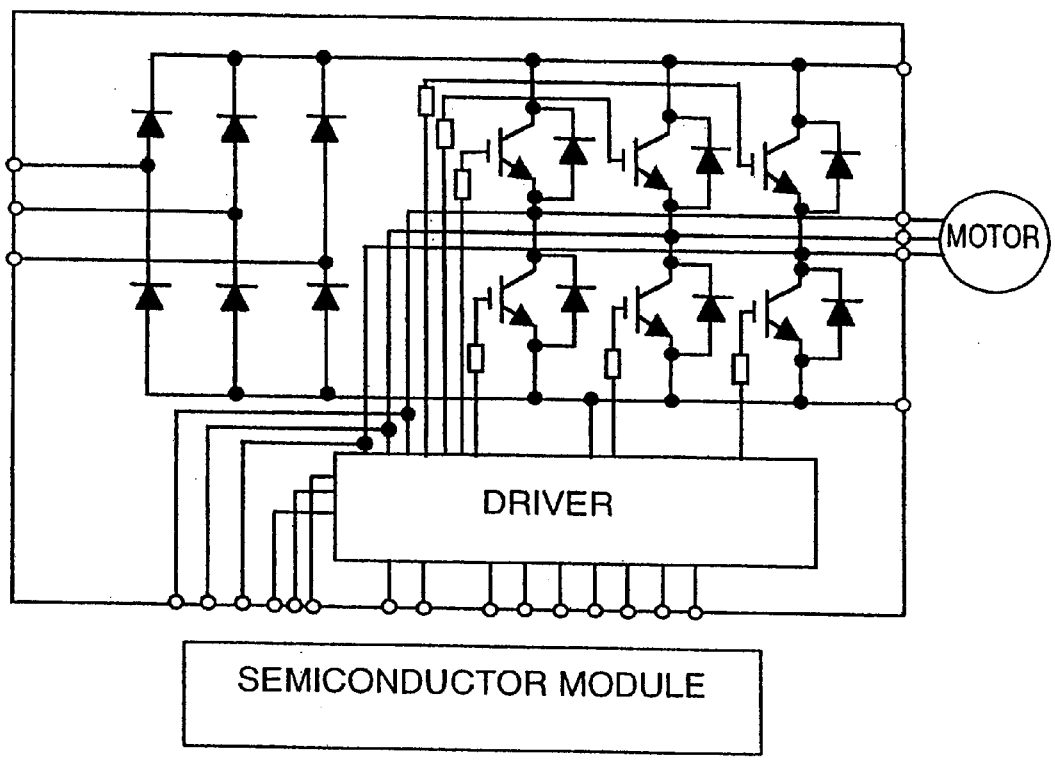
FIG. 7 is a circuit diagram illustrative of the fourth embodiment of the semiconductor device according to the present invention.

FIG. 5 is a sectional view of the semiconductor device, the view being taken along line A–A' of FIG. 6, FIG. 6 is a top plan view of the semiconductor device before sealing with a resin, and FIG. 7 is a circuit diagram of the semiconductor device.

In the embodiment shown in FIGS. 5 to 7, a main circuit including one or more of power semiconductor elements 11 are composed of a lead frame 13, and an integrated circuit 23, such as a driver IC for driving the power semiconductor elements 11, and a peripheral control circuit part 22 are integrally mounted on a printed circuit board 21.

The main circuit is provided with an outward guided terminal 17 formed by bending the lead frame 13, the printed circuit board 21 is provided with a control terminal 24, and all mounted parts are housed in a resin-molded outer package and integrally sealed with a resin sealing agent 32. The numeral 31 in FIG. 6 indicates a mounting hole.

In the case of this embodiment, the arrangement of the printed circuit board 21 and mounted parts within the semiconductor device is mere a part of the arrangement as a semiconductor device. Therefore, by connecting various printed circuit boards for a power supply portion, control portion, communication portion, display portion, etc. not shown in addition to this arrangement, it is possible to arrange a semiconductor device as a power converter and all the more higher level system.

According to the present invention, it is possible to obtain the effects enumerated below:

(1) Because the lead frame in a flat state can be fixedly adhered to the insulating layer, the solder layer can be formed by the screen printing method, with the result that cost reduction can be achieved and, at the same time, the quality control and reliability of the semiconductor device can be enhanced.

(2) For the same reason, also for mounting parts on the lead frame, it can be ensured that there are no obstacles to various mounts such as a die bonder and the like. Therefore, there is little apprehension that mounting conditions might be limited and hence productivity increases.

(3) Because the lead frame can be bent in an arbitrary position during the formation of the outward guided terminal, the position in which the outward guided terminal is led out can be arbitrarily selected and the range to which the semiconductor device is applicable becomes wide.

(4) Because the lead frame itself is a two-dimensionally shaped one, the loading efficiency during transportation can be improved.

(5) It is possible to reduce the size of equipment necessary for fixedly adhering the lead frame under pressure.

What is claimed:

1. A power converter comprising:

a power supply portion;

a control portion; and a semiconductor device in which a lead frame fixedly adhered via an insulating layer to one surface of a base substrate serves as a circuit conductor and on which frame one or more power semiconductor elements are mounted, wherein an end portion of said lead frame is bent to form a stand-up portion in a stand-up direction from the surface of said base substrate as an outward guided terminal, wherein the lead frame has a first thickness in a first portion fixedly adhered to the surface of the base substrate, and wherein the lead frame has a recessed portion having a second thickness, less than the first thickness, said recessed portion being formed in a lower portion of the stand-up portion beginning adjacent to said first portion and extending upwardly along said stand-up portion.

2. The power converter according to claim 1, wherein the stand-up portion of the lead frame from the surface of the base substrate is spaced inwardly apart by a predetermined specific distance from an end surface of the base substrate.

3. The power converter according to claim 2, wherein said recessed portion includes a first recessed portion extending in a direction of the surface of the base substrate and spaced apart from the base substrate, a second recessed portion extending in the stand-up direction along the stand-up portion, and a curved recessed portion which extends between the first recessed portion and the second recessed portion, wherein the curved recessed portion curves from the direction of the surface of the base substrate to the stand-up direction.

4. The power converter according to claim 2, wherein the recessed portion begins at a bend point at which said lead frame beings to bend in the stand-up direction, wherein said bend point is immediately adjacent to said first portion of said lead frame.

5. The power converter according to claim 1, wherein the recessed portion begins at a bend point at which said lead frame begins to bend in the stand-up direction, wherein said bend point is immediately adjacent to said first portion of said lead frame.

* * * * *